US012230691B2

(12) United States Patent
Zhang et al.

(10) Patent No.: US 12,230,691 B2
(45) Date of Patent: Feb. 18, 2025

(54) THREE DIMENSIONAL DEVICE FORMATION USING EARLY REMOVAL OF SACRIFICIAL HETEROSTRUCTURE LAYER

(71) Applicant: Applied Materials, Inc., Santa Clara, CA (US)

(72) Inventors: Yan Zhang, Westford, MA (US); Johannes M. van Meer, Middleton, MA (US); Sankuei Lin, Los Gatos, CA (US); Baonian Guo, Andover, MA (US); Naushad K. Variam, Marblehead, MA (US)

(73) Assignee: Applied Materials, Inc., Santa Clara, CA (US)

( * ) Notice: Subject to any disclaimer, the term of this patent is extended or adjusted under 35 U.S.C. 154(b) by 376 days.

(21) Appl. No.: 17/744,238

(22) Filed: May 13, 2022

(65) Prior Publication Data

US 2023/0369453 A1 Nov. 16, 2023

(51) Int. Cl.
*H01L 29/66* (2006.01)
*H01L 29/06* (2006.01)
*H01L 29/40* (2006.01)
*H01L 29/423* (2006.01)
*H01L 29/786* (2006.01)

(52) U.S. Cl.
CPC .... *H01L 29/66545* (2013.01); *H01L 29/0665* (2013.01); *H01L 29/401* (2013.01); *H01L 29/42392* (2013.01); *H01L 29/66553* (2013.01); *H01L 29/78696* (2013.01)

(58) Field of Classification Search
CPC .......... H01L 29/66545; H01L 29/0665; H01L 29/42392; H01L 29/66553; H01L 29/78696
See application file for complete search history.

(56) References Cited

U.S. PATENT DOCUMENTS

| 2022/0037529 A1* | 2/2022 | Kim | H01L 29/7851 |
| 2023/0187210 A1* | 6/2023 | Zhang | H01L 29/66439 |
| | | | 438/284 |
| 2024/0014294 A1* | 1/2024 | Wu | H01L 29/42372 |

OTHER PUBLICATIONS

H. Mertens, et. al., "Vertically Stacked Gate-All-Around Si Nanowire CMOS Transistors with Dual Work Function Metal Gates," IMEC, 2016 IEEE International Electron Devices Meeting (IEDM), 4 pages.
Cheng, et al., Investigation on thermal stability of Si0.7Ge0.3/Si stacked multilayer for gate-all-around MOSFETS Semicond. Sci. Technol. 35 (2020) 115008, 6 pages.
Loubet, et al., "A Novel Dry Selective Etch of SiGe for the Enablement of High Performance Logic Stacked Gate-All-Around NanoSheet Devices", 2019 IEEE International Electron Devices Meeting (IEDM), 4 pages.

* cited by examiner

*Primary Examiner* — Joseph C. Nicely
(74) *Attorney, Agent, or Firm* — KDW FIRM PLLC

(57) ABSTRACT

A method for forming a nanosheet device. The method may include providing a heterostructure device stack above a semiconductor substrate. The method may include patterning the heterostructure device stack to define a dummy gate region, and before forming a source drain recess adjacent the dummy gate region, selectively removing a first set of sacrificial layers of the heterostructure device stack within the dummy gate region.

20 Claims, 5 Drawing Sheets

THREE DIMENSIONAL DEVICE FORMATION USING EARLY REMOVAL OF SACRIFICIAL HETEROSTRUCTURE LAYER

FIELD

The present embodiments relate to three dimensional semiconductor devices, and in particular device formation using sacrificial semiconductor layers.

BACKGROUND

In order to continue to scale performance of semiconductor devices, such as logic devices, new nanosheet-type device architectures have been investigated, including gate-all-around (GAA), forksheet, and complementary FETs (CFET).

A common feature in these nanosheet (NS) architectures is the use of multiple sacrificial SiGe epitaxial layers as seeds for formation of stacked epitaxial Si channels. The eventual structure to be formed in these type of devices includes a stack of silicon channels that are isolated from one another by removal of a sacrificial layer that is initially grown between the silicon channels. Thus, the initial structure may be a heterostructure or superlattice made from alternating Si layers and SiGe layers, where the SiGe layers are removed before device formation is completed. Due to the existence of these sacrificial SiGe epi layers, there are certain restrictions and challenges for process integration of NS devices, which challenges tend to increases cost, time, complexity and eventually impact performance, yield, cost and time.

In one example, ion implantation applications are constricted for NS-type device formation, because ion implantation may enhance SiGe/Si intermixing and thus increases Si channel thickness variability. In another aspect the temperature for thermal treatment of NS devices may be restricted to be below approximately 900° C., above which temperature Si—Ge interdiffusion may be pronounced, which interdiffusion will increase Si channel thickness variability. Another challenge for NS device processing is the requirement for different etch-selectivity in order to properly remove the sacrificial SiGe layer(s). During process stages such as inner spacer formation and Si channel release, a relatively different selective etch to remove SiGe will lead to different amount of Si loss in the silicon channel layers, and thus increase Si thickness variability.

With respect to these and other considerations, the present disclosure is provided.

BRIEF SUMMARY

In one embodiment, a method for forming a nanosheet device is provided. The method may include providing a heterostructure device stack above a semiconductor substrate. The method may include patterning the heterostructure device stack to define a dummy gate region, and before forming a source drain recess adjacent the dummy gate region, selectively removing a first set of sacrificial layers of the heterostructure device stack within the dummy gate region.

In another embodiment, a method for forming a nanosheet device may include forming a heterostructure device stack on a semiconductor fin, the heterostructure device stack comprising a set of silicon layers arranged in a vertical stack and in alternating fashion with a set of SiGe layers. The method may also include patterning the heterostructure device stack to define a dummy gate region, disposed over the semiconductor fin, and selectively removing the set of SiGe layers of the heterostructure device stack within the dummy gate region. The method may further include, after the selectively removing, forming a source/drain structure adjacent to the dummy gate region.

In an additional embodiment, a method for forming a nanosheet device may include: forming a heterostructure device stack on a semiconductor fin, where the heterostructure device stack includes a set of silicon layers arranged in a vertical stack and in alternating fashion with a second set of SiGe layers. The method may further include patterning the heterostructure device stack to define a dummy gate region, disposed over the semiconductor fin. The method may also include selectively removing the set of SiGe layers within the dummy gate region to form a set of cavities; filling the set of cavities with a sacrificial material; and forming a source/drain structure adjacent to the dummy gate region.

DETAILED DESCRIPTION

Figure 1A:
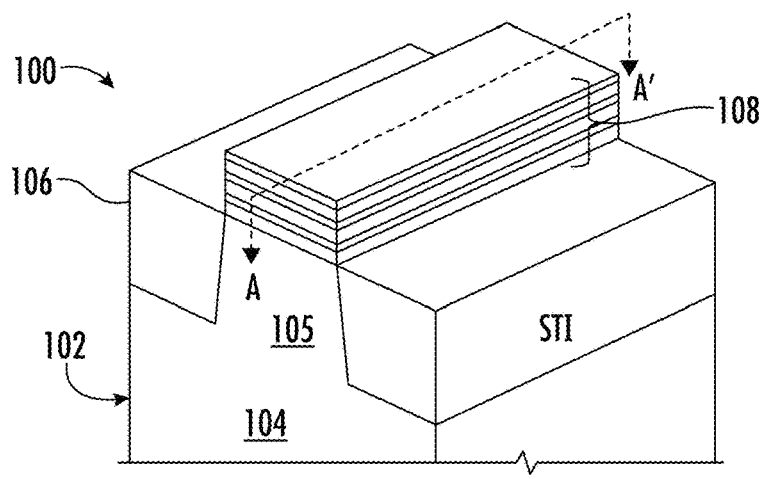
FIGS. 1A-1M depict various stages in the formation of a nanosheet device, according to some embodiments of the disclosure.

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

The present embodiments provide novel approaches to forming three dimensional devices, and in particular, with respect to fabrication of nanosheet devices. On such fabrication approach consistent with some embodiments of the disclosure is illustrated in the FIGS. 1A-1M. Turning to FIG. 1A and FIG. 1D, there is shown one instance during fabrication of a nanosheet device, according to embodiments of the disclosure. FIG. 1A provides a top perspective view, while FIG. 1D shows a side cross-sectional view along the section A-A'. A device 100 is shown, formed within a substrate 102, where the substrate 102 may include various layers and structures. At this stage of formation, a semiconductor layer 104 has been patterned to form a fin structure that extends from a lower portion of the semiconductor layer 104 and is bounded by an insulator layer. A heterostructure device stack 108 has been grown upon a top surface of the fin structure 105. As an example, the heterostructure device stack may be formed from a set of Si layers that alternate with a set of SiGe layers, where the set of SiGe layers are to be used as a set of sacrificial layers. For purposes of illustration a first set of layers, to remain in the final device, are referred to as silicon layers 110. The silicon layers 110 are formed in alternating fashion with a set of sacrificial layers shown as sacrificial layers 112, such as SiGe layers. The composition of SiGe layers may be within a known range of composition for NS devices, where the SiGe layer is to be selectively removed. As such, the composition will be such that selective etching of the sacrificial layers 112 may be performed without undue etching of the silicon layers 110.

Figure 1B:
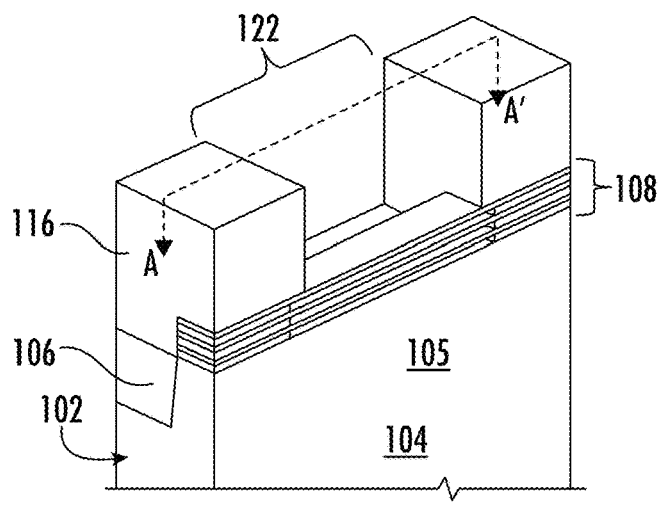
Figure 1C:
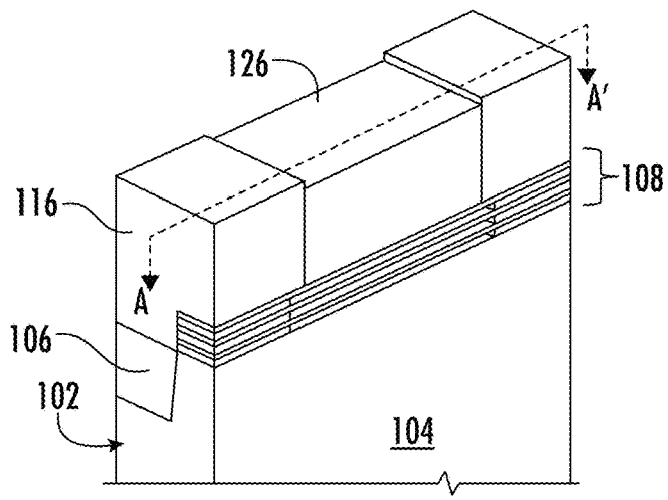
Figure 1D:
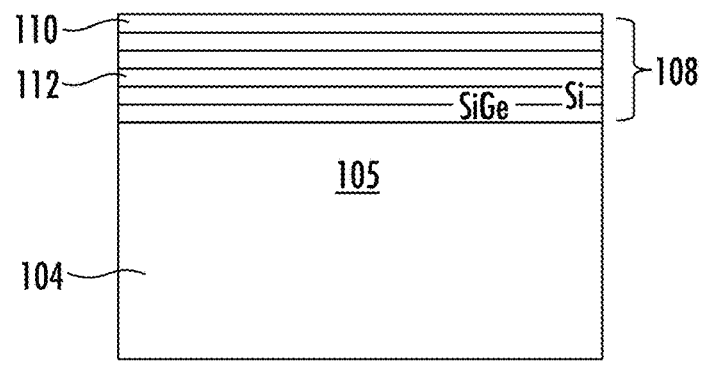
Figure 1E:
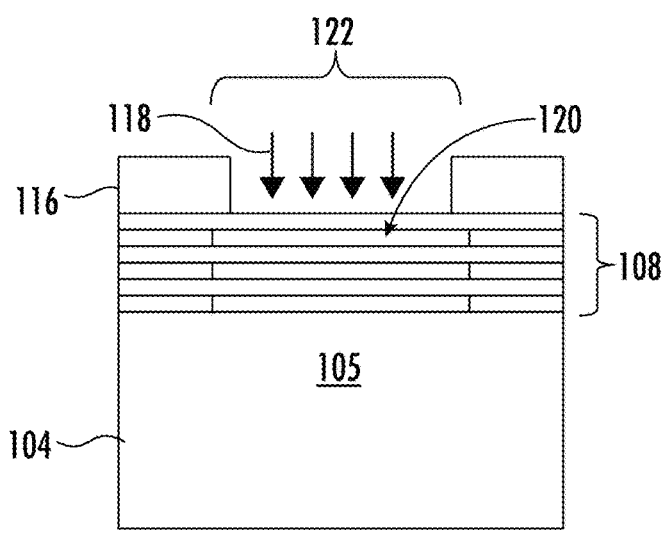

Turning to FIG. 1B and FIG. 1E, there is shown a subsequent instance during fabrication of the device 100, according to embodiments of the disclosure. FIG. 1B provides a top cross-sectional perspective view, while FIG. 1E shows a side cross-sectional view along the section A-A'. At this instance, patterning of the heterostructure device stack 108 has taken place to form a dummy gate region 122, using a mask 116, such as photoresist. The dummy gate region 122 defines a region where a final gate structure of the NS transistor devices is to be formed. The final gate structure to be formed may entail a so-called replacement metal gate process. At this instance, the sacrificial layer(s) 112 have been selectively removed, unlike known techniques for forming nanosheet devices where removal of sacrificial layers takes place just before a replacement metal gate material is introduced into the device. The removal of the sacrificial layers 112 results in the formation of a set of cavities 120, which set alternates with the silicon layers 110, as shown.

While not explicitly shown, at this stage of fabrication, implantation processes 118 may be performed, such as threshold voltage (Vt) adjustment implants. Because the sacrificial layer 112, such as SiGe has been removed, implantation may be performed without encountering implant-induced mixing of an SiGe layer and adjacent Si layer in the case where the sacrificial layer 112 were not removed. Moreover, any suitable high temperature treatment of the device 100 may be performed similarly without concern regarding Si—Ge interdiffusion that might otherwise take place were the sacrificial layer 112 still in place.

Figure 1F:
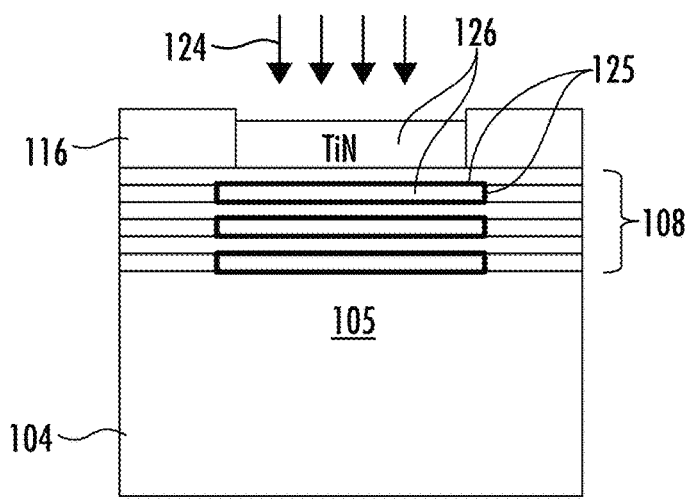

Turning to FIG. 1C and FIG. 1F, there is shown a subsequent instance during fabrication of the device 100, according to embodiments of the disclosure. FIG. 1C provides a top cross-sectional perspective view, while FIG. 1F shows a side cross-sectional view along the section A-A'. At this instance, the dummy gate region 122 has been filled with a dielectric liner 125 and a sacrificial fill material 126. The sacrificial fill material 126 may be any suitable flowable material, such as such as TiN, or other suitable material. The sacrificial fill material 126 may be of a suitable composition and structure so as to be selectively removable with respect to silicon from the dummy gate region 122, at a later instance. As shown, the sacrificial fill material 126 has filled the cavities 120, between silicon layers 110. At the stage shown, a polish, such as chemical mechanical polishing (CMP) may have been performed to generate the structure shown. As with the stage of FIG. 1B, any suitable implantation process 124 or thermal treatment may be performed without concern regarding interdiffusion or intermixing between a silicon layer and (now absent) SiGe layer. Note that the dielectric liner 125 may be a conformally deposited dielectric liner that is formed by a suitable conformal deposition process, after the SiGe removal operation in FIG. 1B and FIG. 1E, in order to coat surfaces within the cavities 120. Therefore, the dielectric liner 125 will cover all Si/cavity interfaces including top, bottom and sides of cavity. This dielectric liner is important for the following reasons: the top/bottom part of the dielectric liner 125 can be used to avoid Si loss from silicon layers 110, and thus maintain a high degree of Si channel uniformity. Note also that in a replacement gate module, after removing the dummy filling material, this dielectric liner 125 may need to be removed as well, and a thin oxide layer then selectively deposited along the Si surface to function as gate oxide, before a high dielectric constant (high-k) layer and metal stack is deposited.

Figure 1G:
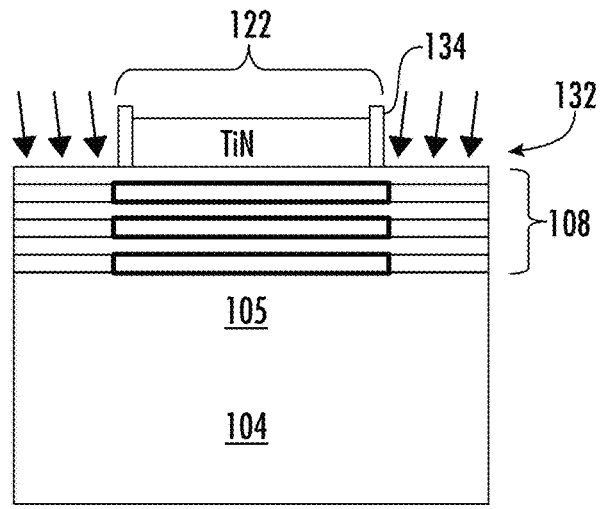

In the stages of FIGS. 1G-1M to follow, the view is along the A-A' section. Turning in particular to FIG. 1G, there is shown a subsequent instance after removal of the mask 116, where a gate spacer 134 has been formed along a top sacrificial layer of the fill material 126. As with the stage of FIG. 1B, any suitable implantation process 124, such as LDD implant, or any thermal treatment may be performed without concern regarding interdiffusion or intermixing between a silicon layer and (now absent) SiGe layer.

Figure 1H:
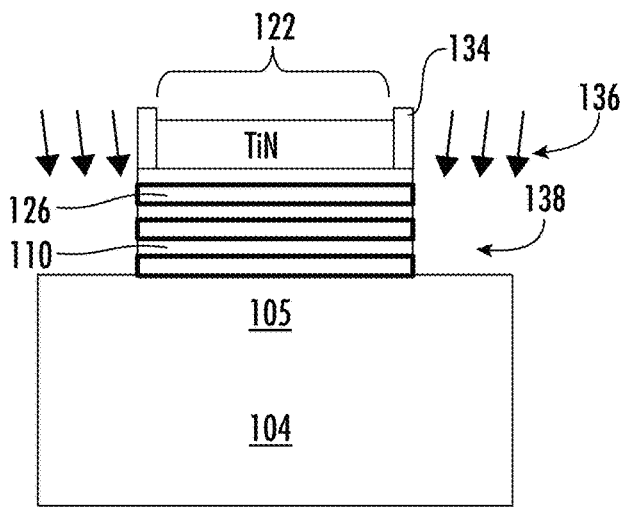

Turning in particular to FIG. 1H, there is shown a subsequent instance where a portion of the heterostructure device stack 108, adjacent the dummy gate region 122, has been removed, so that a source/drain region 138 comprising monocrystalline semiconductor is exposed. As with the stage of FIG. 1B, any suitable implantation process 136, such as cavity implant, or any thermal treatment may be performed without concern regarding interdiffusion or intermixing between a silicon layer and (now absent) SiGe layer.

Figure 1I:
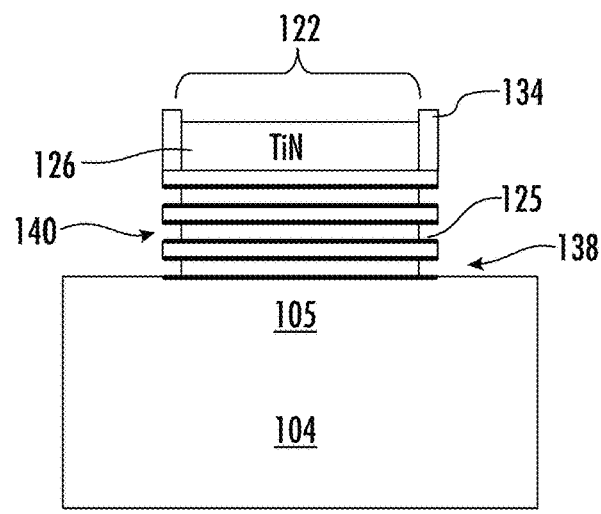

Turning in particular to FIG. 1I, there is shown a subsequent instance where a side portion of the sacrificial fill material 126, such as TiN, is etched back. Note that at this stage of processing a dielectric liner 125 the dark edge of the filled dummy material) is in place. Because of the presence of the dielectric liner 125, the sacrificial fill material 126 (e.g. TiN) can be etched back without impacting on the silicon layers, and thus Si channel uniformity may remain unaffected by this etch process. Also, high-temperature treatment of the device 100 is possible at this stage without concern for Si—Ge inter-diffusion.

Figure 1J:
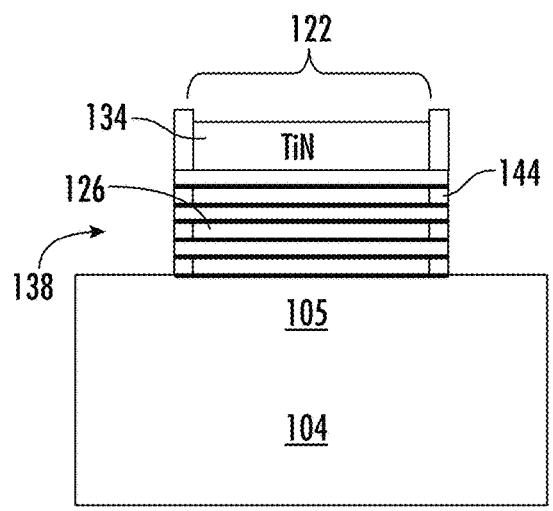

Continuing to FIG. 1J, there is shown a subsequent instance where an inner spacer 144 has been formed along the sides of the dummy gate region 122. The inner spacer 144 may be a known material as in known nanosheet devices that is used to isolate the source/drain region 138 from a gate stack formed in the dummy gate region 122. In particular, the inner spacer 144 is formed in the recesses 140 (see FIG. 1I) along the edge of the sacrificial fill material 126 layers, such as TiN fill layers. Again, high-temperature treatment of the device 100 is possible at this stage without concern for Si—Ge inter-diffusion.

Figure 1K:
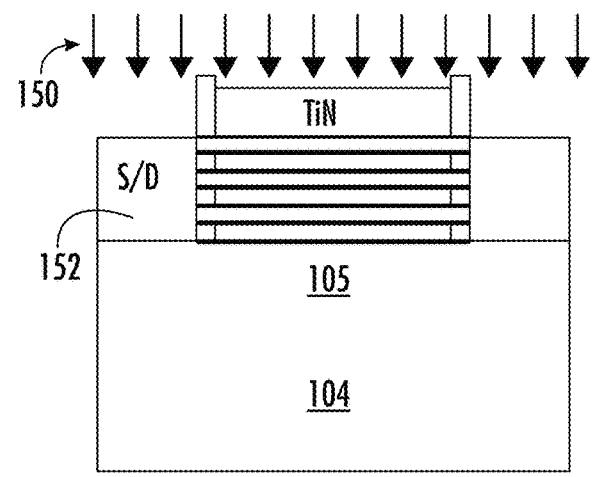

Continuing to FIG. 1K, there is shown a subsequent instance where a raised source/drain structure 152 is formed along the sides of the dummy gate region 122 and directly upon the fin structure 105. Because of the absence of a SiGe layer, any implant procedure 150 (e.g. S/D implant) may be performed at this stage without concern for implant-induced Si—Ge inter-mixing. Again, high-temperature treatment of the device 100 is possible at this stage without concern for Si—Ge inter-diffusion.

Figure 1L:
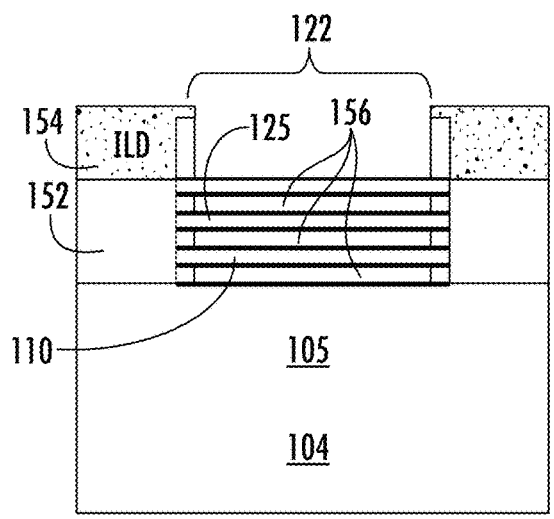

Continuing to FIG. 1L, there is shown a subsequent instance where a dielectric layer 154, such as an interlevel dielectric, has been formed. The layers of sacrificial fill material 126 have also been removed, leaving the cavities 156. Because a dielectric liner 125, such as SiN, is in place, the removal of sacrificial fill material 126 will not affect silicon layers 110, and thus won't affect silicon channel uniformity in the final deice to be formed.

Figure 1M:
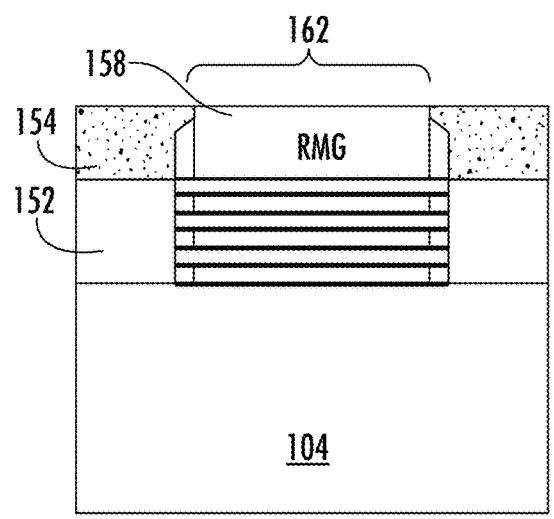

Continuing to FIG. 1M, there is shown a subsequent instance where a replacement gate 162 has been formed using a metal gate material 158 that has been introduced to fill the cavities 156. Note that in some embodiments, the type of gate oxide used in conjunction with the metal gate material 158 may include an atomic layer deposition (ALD) oxide, such as SiO2.

Figure 2:
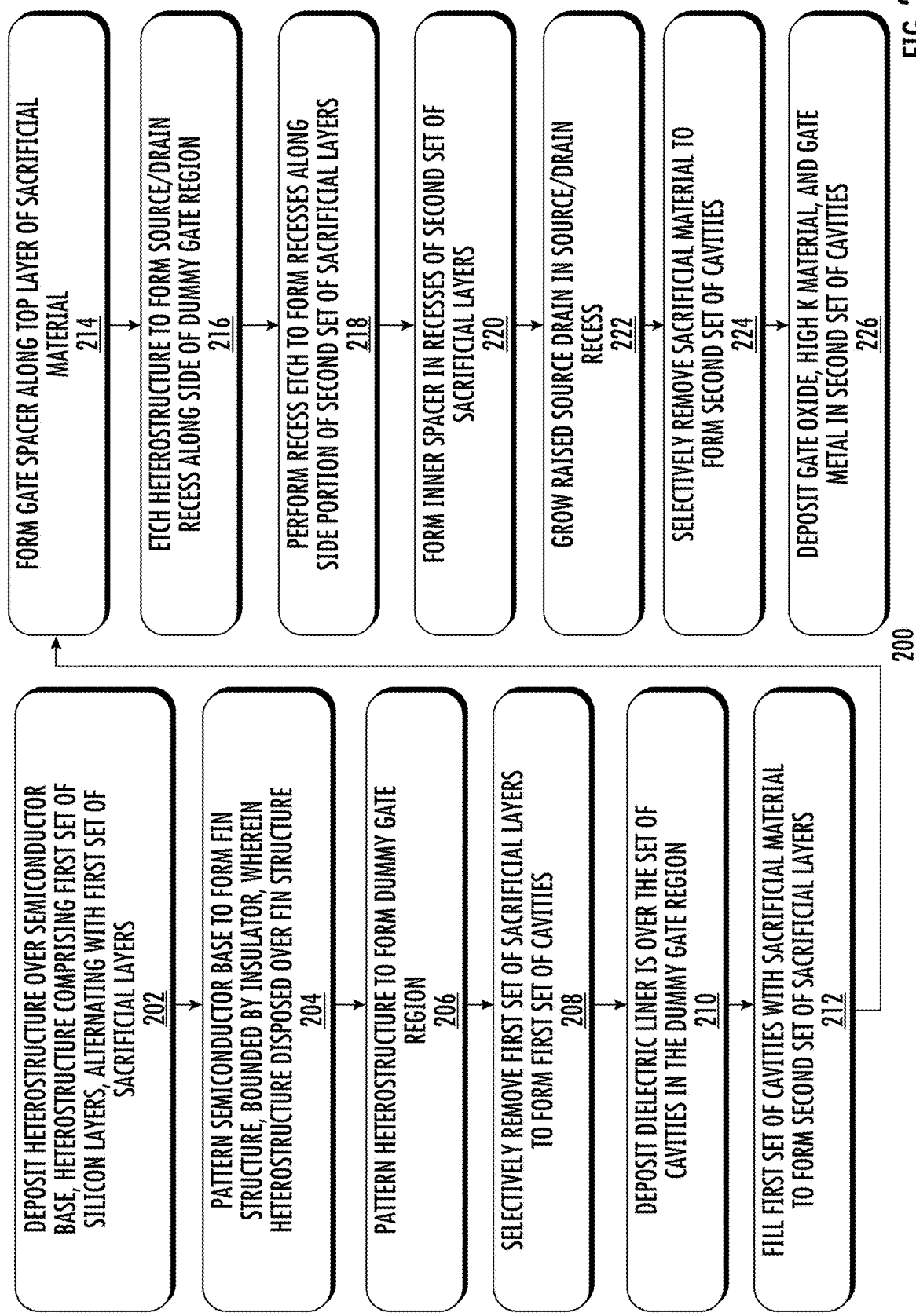
FIG. 2 depicts an exemplary process flow.

FIG. 2 depicts a process flow 200, according to some embodiments of the disclosure. At block 202 a heterostructure is deposited over a semiconductor base. The semiconductor base may be a monocrystalline semiconductor substrate, such as silicon. The heterostructure may be formed of a set of silicon layers, alternating with a first set of sacrificial layers. As an example, the first set of sacrificial layers may be formed of a SiGe alloy, so that the overall heterostructure represents a superlattice of alternating silicon and silicon:germanium layers that are epitaxially grown on the monocrystalline semiconductor substrate. In some examples the mole fraction of the germanium may be in the range of 10% to 30%. As such, the silicon layers of the heterostructure may retain a monocrystalline character.

At block 204 the substrate is patterned to form a fin structure, bounded by an insulator. For example, the heterostructure and underlying monocrystalline silicon base may be etched to form a fin shape, where the heterostructure is disposed over the monocrystalline silicon in the fin structure, and the monocrystalline silicon base is exposed outside of the fin structure. An insulator, such as shallow trench isolation material, may be formed on the semiconductor base, outside of the fin structure.

At block 206, the heterostructure is patterned to form a dummy gate region, such as by using a known mask material, lithography and etch process.

At block 208, the first set of sacrificial layers in the heterostructure is selectively removed to form a first set of cavities that alternate with the silicon layers. For example, in the case of SiGe layers, a known selective etch may be employed to remove the SiGe material without etching the silicon layers.

At block 210, a dielectric liner is deposited over the set of cavities in the dummy gate region. Note: the ALD dielectric liner is conformally deposited all interfaces of the cavity, i.e. top and bottom Si layers, and sides of cavities.

At block 212, the first set of cavities is filled with sacrificial material to form a second set of sacrificial layers. In one example, the sacrificial material may be TiN.

At block 214, a gate spacer is formed along a top layer of the sacrificial material.

At block 216, the heterostructure is etched in regions outside the dummy gate region to form a source/drain recess along the side of the dummy gate region.

At block 218, a recess etch is performed to form recesses along the side portion of the second set of sacrificial layers.

At block 220 an inner spacer is formed in the recesses of the second set of sacrificial layers. The flow then proceeds to block 222.

At block 222, a raised source/drain is grown over the source/drain recess.

At block 224, the sacrificial material of the heterostructure as well as the dielectric liner are selectively removed to form a second set of cavities.

At block 226, a gate oxide, high-k dielectric material, and with gate metal stack are deposited in the second set of cavities, such that a metal gate structure is formed in a manner to provide a three dimensional gate around the silicon layers.

The present embodiments provide several advantages in respect to current approaches for 3-d device formation. For one advantage, the novel process approach eliminates the problems of implant-induced Si—Ge inter-mixing (e.g. LDD implant, extension implant, cavity implant, S/D implant, et. al) that may take place in present day approaches to nanosheet device formation, where SiGe sacrificial layers are not removed until just before gate metal deposition. For another advantage, the present approach facilitates use of a relatively higher thermal budget during many stages of device processing after formation of a heterostructure of alternating silicon layers, since sacrificial SiGe is removed directly after formation of a Si/SiGe heterostructure. For a further advantage different-etch-step induced Si channel non-uniformity is overcome by the present process approach.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, the present disclosure has been described herein in the context of a particular implementation in a particular environment for a particular purpose, while those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A method for forming a nanosheet device, comprising:
providing a heterostructure device stack above a semiconductor substrate;
patterning the heterostructure device stack to define a dummy gate region; and
before forming a source drain recess adjacent the dummy gate region, selectively removing a first set of sacrificial layers of the heterostructure device stack within the dummy gate region.

2. The method of claim 1, the heterostructure device stack having a set of Si layers alternating with a set of SiGe layers, the set of SiGe layers forming the first set of sacrificial layers.

3. The method of claim 1, wherein after the selectively removing the first set of sacrificial layers, the dummy gate region comprises a set of silicon (Si) layers that alternate with a set of cavities.

4. The method of claim 3, further comprising filling the set of cavities with a conformally deposited dielectric liner within the set of cavities.

5. The method of claim 4, further comprising filling the set of cavities with a flowable material to form a second set of sacrificial layers in the dummy gate region.

6. The method of claim 5, further comprising forming a gate spacer on a top sacrificial layer of the dummy gate region.

7. The method of claim 6, further comprising:
removing a portion of the heterostructure device stack, adjacent the dummy gate region, wherein a source/drain (S/D) region comprising monocrystalline semiconductor is exposed and etched to form a S/D cavity.

8. The method of claim 7, further comprising:
etching back a side portion of the second set of sacrificial layers;
and filling the side portion with a dielectric material to form an inner spacer.

9. The method of claim 8, further comprising: selectively growing a raised source/drain on the source/drain region.

10. The method of claim 9, further comprising;
forming a dielectric material above the source/drain region;

selectively removing the second set of sacrificial layers from the dummy gate region, wherein a second set of cavities is formed;

removing the conformally deposited dielectric liner; and filling the second set of cavities with a gate oxide, a high-k layer, and a metal gate stack filling.

11. A method for forming a nanosheet device, comprising:

forming a heterostructure device stack on a semiconductor fin, the heterostructure device stack comprising a set of silicon layers arranged in a vertical stack and in alternating fashion with a set of SiGe layers;

patterning the heterostructure device stack to define a dummy gate region, disposed over the semiconductor fin;

selectively removing the set of SiGe layers of the heterostructure device stack within the dummy gate region; and after the selectively removing, forming a source/drain structure adjacent to the dummy gate region.

12. The method of claim 11, wherein after the selectively removing the set of SiGe layers, the dummy gate region comprises a set of silicon (Si) layers that alternate with a set of cavities.

13. The method of claim 12, further comprising filling the set of cavities with a flowable material to form a set of sacrificial layers in the dummy gate region.

14. The method of claim 13, further comprising forming a gate spacer on a top sacrificial layer of the set of sacrificial layers of the dummy gate region.

15. The method of claim 14, further comprising:

removing a portion of the heterostructure device stack, adjacent the dummy gate region, wherein a source/drain region comprising monocrystalline semiconductor is exposed; and forming the source/drain structure by selectively growing a raised source/drain on the source/drain region.

16. The method of claim 15, further comprising;

forming a dielectric material above the raised source/drain;

selectively removing the set of sacrificial layers from the dummy gate region, wherein a second set of cavities is formed; and filling the second set of cavities with a metal gate filling.

17. A method for forming a nanosheet device, comprising:

forming a heterostructure device stack on a semiconductor fin, the heterostructure device stack comprising:

a set of silicon layers arranged in a vertical stack and in alternating fashion with a set of SiGe layers;

patterning the heterostructure device stack to define a dummy gate region, disposed over the semiconductor fin;

selectively removing the set of SiGe layers within the dummy gate region to form a set of cavities;

filling the set of cavities with a sacrificial material; and forming a source/drain structure adjacent to the dummy gate region.

18. The method of claim 17, wherein the set of cavities is filled with a flowable material to form a set of sacrificial layers in the dummy gate region.

19. The method of claim 18, further comprising:

removing a portion of the heterostructure device stack, adjacent the dummy gate region, wherein a source/drain region comprising monocrystalline semiconductor is exposed; and forming the source/drain structure by selectively growing a raised source/drain on the source/drain region.

20. The method of claim 19, further comprising;

forming a dielectric material above the source/drain region;

selectively removing the set of sacrificial layers from the dummy gate region, wherein a second set of cavities is formed; and filling the second set of cavities with a metal gate filling.

* * * * *